US012469666B2

(12) United States Patent
McLaughlin et al.

(10) Patent No.: US 12,469,666 B2
(45) Date of Patent: Nov. 11, 2025

(54) LATTICE BASED VOLTAGE STANDOFF

(71) Applicant: Applied Materials, Inc., Santa Clara, CA (US)

(72) Inventors: Adam M. McLaughlin, Merrimac, MA (US); Craig R. Chaney, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 619 days.

(21) Appl. No.: 18/070,640

(22) Filed: Nov. 29, 2022

(65) Prior Publication Data

US 2024/0177960 A1 May 30, 2024

(51) Int. Cl.
*H01J 37/147* (2006.01)
*H01J 37/317* (2006.01)

(52) U.S. Cl.
CPC ........ *H01J 37/147* (2013.01); *H01J 37/3171* (2013.01); *H01J 2237/032* (2013.01); *H01J 2237/038* (2013.01)

(58) Field of Classification Search
CPC ................. H01J 37/147; H01J 37/3171; H01J 2237/032; H01J 2237/038; H01J 2237/061; H01J 37/08
USPC ..................................................... 250/492.21
See application file for complete search history.

(56) References Cited

U.S. PATENT DOCUMENTS

| | | | |
|---|---|---|---|
| 4,634,806 | A | 1/1987 | Haag et al. |
| 5,703,372 | A | 12/1997 | Horsky et al. |
| 7,804,076 | B2 | 9/2010 | Huang et al. |
| 9,711,318 | B2 | 7/2017 | White |
| 10,074,508 | B2 | 9/2018 | Baggett et al. |
| 2004/0188631 | A1 | 9/2004 | Horsky et al. |
| 2004/0256578 | A1 | 12/2004 | Mitchell et al. |
| 2007/0262270 | A1 | 11/2007 | Huang et al. |
| 2009/0236547 | A1 | 9/2009 | Huang et al. |
| 2012/0058252 | A1 | 3/2012 | Sweeney et al. |
| 2014/0103017 | A1 | 4/2014 | Ashtekar et al. |
| 2018/0209035 | A1 | 7/2018 | Liu et al. |
| 2018/0350553 | A1 | 12/2018 | Baggett et al. |

(Continued)

FOREIGN PATENT DOCUMENTS

| | | |
|---|---|---|
| CN | 207139151 U | 3/2018 |
| CN | 213845219 U | 7/2021 |

(Continued)

OTHER PUBLICATIONS

Office Action mailed Jul. 15, 2025 in co-pending U.S. Appl. No. 17/957,095.

(Continued)

*Primary Examiner* — Michael Maskell
(74) *Attorney, Agent, or Firm* — Nields, Lemack & Frame, LLC

(57) ABSTRACT

An insulator that has a lattice is disclosed. The insulator may have a shaft with two ends. The lattice may be disposed on the outer surface of the shaft. In some embodiments, one or more sheaths are used to cover portions of the shaft. A lattice may also be disposed on the inner wall and/or outer walls of the sheaths. The lattice serves to increase the tracking length between the two ends of the shaft. This results in longer times before failure. This insulator may be used in an ion implantation system to physically and electrically separate two components.

17 Claims, 10 Drawing Sheets

(56) References Cited

U.S. PATENT DOCUMENTS

| | | | |
|---|---|---|---|
| 2020/0163709 A1 | 5/2020 | Ostroot et al. | |
| 2020/0211809 A1 | 7/2020 | Yen et al. | |
| 2022/0154328 A1* | 5/2022 | Ishida ............... | H01J 37/32532 |
| 2022/0301808 A1 | 9/2022 | Ochi | |

FOREIGN PATENT DOCUMENTS

| | | | |
|---|---|---|---|
| EP | 3813082 | A1 | 4/2021 |
| JP | 2018-533184 | A | 11/2018 |
| JP | 2022-81201 | A | 5/2022 |
| KR | 2008-0051862 | A | 6/2008 |
| KR | 2018-0081483 | A | 7/2018 |
| TW | 373209 | B | 11/1999 |
| TW | 521295 | B | 2/2003 |
| TW | 201535453 | A | 9/2015 |
| WO | 2020/123061 | A1 | 6/2020 |

OTHER PUBLICATIONS

International Search Report and Written Opinion mailed Feb. 7, 2024 in corresponding PCT application No. PCT/US2023/035396.

International Search Report and Written Opinion mailed Dec. 11, 2023 in co-pending PCT application No. PCT/US2023/030707.

* cited by examiner

LATTICE BASED VOLTAGE STANDOFF

FIELD

Embodiments of the present disclosure relate to an insulator, and more particularly an insulator utilizing a lattice for use in an ion implantation system.

BACKGROUND

Ion implantation is a common technique to introduce impurities into a workpiece to affect the conductivity of portions of that workpiece. For example, ions that contain elements in Group III, such as boron, aluminum and gallium, may be used to create P-type regions in a silicon workpiece. Ions that contain elements in Group V, such as phosphorus and arsenic, may be used to create N-type regions in the silicon workpiece. Of course, other species may also be used.

In some ion implantation systems, ions are generated in an ion source and are extracted through an extraction aperture. In some embodiments, one or more electrodes, which are electrically biased, are located outside the ion source, proximate the extraction aperture. The voltage applied to one of these electrodes serves to attract ions from within the ion source such that the ions exit the ion source through the extraction aperture.

Insulators are located between the ion source and each of the electrodes to maintain different voltages on each of these components. Additionally, insulators may be located in other locations, such as between conductive rods in an energy purity module (EPM), as feet for various sections or the system and other locations. Thus, the placement of the insulators is not limited. However, over time, deposition, which is caused by the material that is extracted from the ion source, begins to coat the insulators. Over time, the coating on the insulator may be sufficiently thick such that an electrical path forms along the exterior edge of the insulator. This may cause two of these components to be electrically shorted. In this scenario, the ion implantation system is taken off line so that the insulator can be cleaned or replaced. This reduces throughput and hurts efficiency.

Therefore, it would be advantageous if there were an insulator that could be used in an ion implantation system that was more resistant to these electrical shorts.

SUMMARY

An insulator that has a lattice is disclosed. The insulator may have a shaft with two ends. The lattice may be disposed on the outer surface of the shaft. In some embodiments, one or more sheaths are used to cover portions of the shaft. A lattice may also be disposed on the inner wall and/or outer walls of the sheaths. The lattice serves to increase the tracking length between the two ends of the shaft. This results in longer times before failure. This insulator may be used in an ion implantation system to physically and electrically separate two components.

According to one embodiment, an insulator is disclosed. The insulator comprises a shaft having a first end and a second end; and a shaft lattice disposed on an outer surface of the shaft. In some embodiments, a density of the shaft lattice is not constant along a length of the shaft. In certain embodiments, the density of the shaft lattice is greater at the first end and at the second end than at a location between the first end and the second end. In some embodiments, the insulator comprises a sheath surrounding a portion of the shaft, where the shaft lattice is disposed in a space between the shaft and an inner wall of the sheath. In certain embodiments, the sheath is made from a conductive material, is attached to the first end of the shaft and extends toward the second end. In certain embodiments, the sheath is made from an insulating material and extends from the first end of the shaft toward the second end. In some embodiments, an inner sheath lattice is disposed on the inner wall of the sheath in the space between the shaft and the inner wall of the sheath. In some embodiments, the inner sheath lattice is interwoven with the shaft lattice. In some embodiments, an outer sheath lattice is disposed on an outer wall of the sheath. In certain embodiments, the insulator comprises a second sheath covering a second portion of the shaft. In certain embodiments, the sheath and the second sheath are made from an insulating material and an inner sheath lattice is disposed on the inner wall of the sheath and an inner wall of the second sheath. In certain embodiments, the second sheath extends from the second end of the shaft toward the first end. In some embodiments, the second sheath extends from the shaft at a position between the first end and the second end and extends toward the second end.

According to another embodiment, an ion implantation system is disclosed. The ion implantation system comprises an ion source; at least two electrodes disposed outside the ion source; and the insulator described above, disposed between the at least two electrodes to physically and electrically separate the at least two electrodes from each other.

According to another embodiment, an insulator is disclosed. The insulator comprises an open box having a plurality of mounting holes for connection to an indirectly heated cathode ion source and other components, where one or more of the plurality of mounting holes are disposed on an inner surface of the open box; and a lattice disposed in the open box and between the plurality of mounting holes so as to increase a tracking length.

According to another embodiment, an ion implantation system is disclosed. The ion implantation system comprises an indirectly heated cathode ion source having a cathode and a filament; a cathode support member to hold the cathode and supply a bias voltage to the cathode; clamps to supply a current to the filament; and the insulator described above, wherein one or more of the plurality of mounting holes are used to hold the cathode support member and one or more of the plurality of mounting holes are used to secure the clamps.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
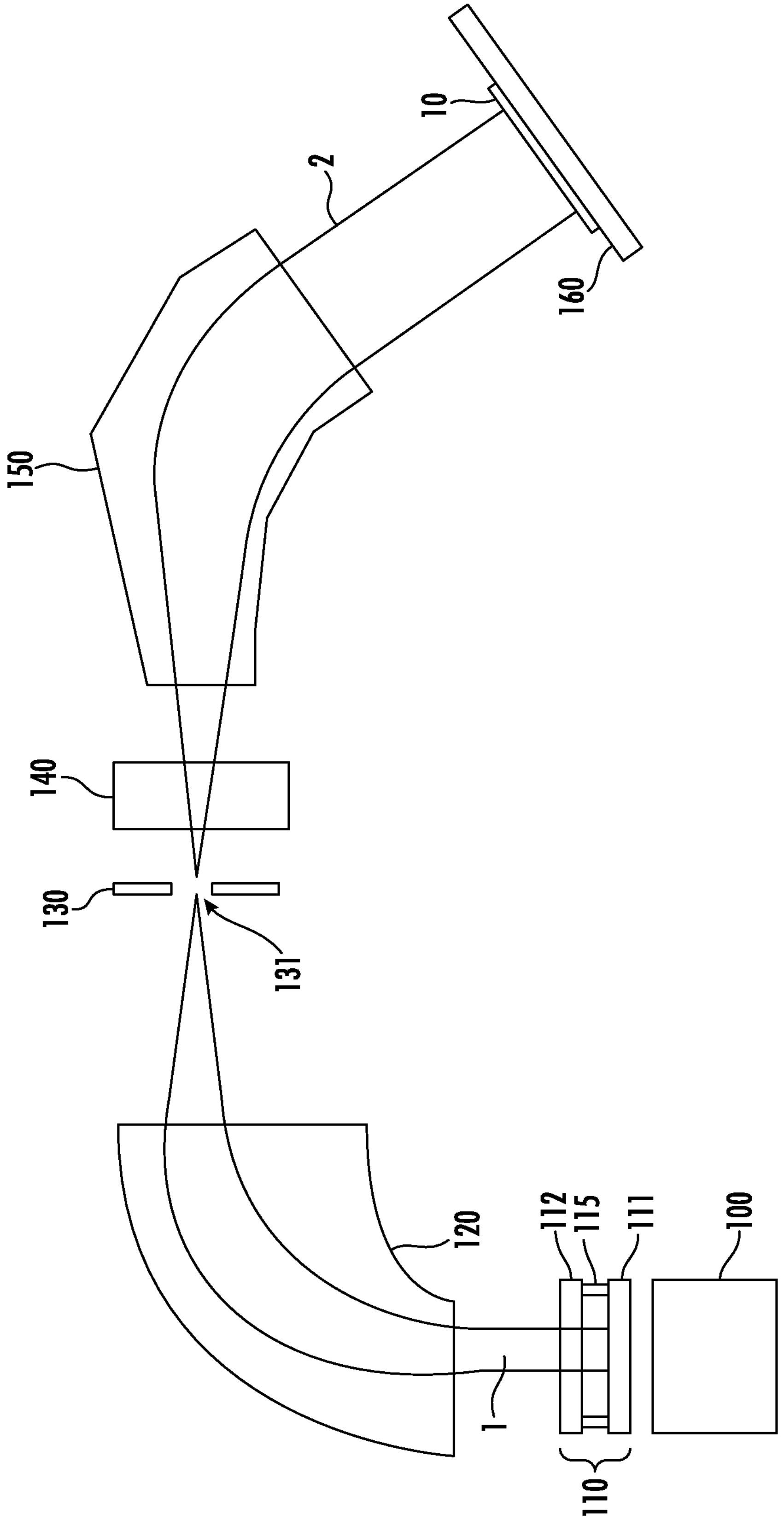
FIG. 1 is an ion implanter that utilizes the insulator according to one embodiment.

FIG. 1 shows an ion implantation system that may be used for implanting ions into a workpiece using an ion beam according to one embodiment.

The ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, the ion source 100 may be an IHC ion source. In this embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The extraction aperture may be any suitable shape. In certain embodiments, the extraction aperture may be oval or rectangular shaped.

Disposed outside and proximate the extraction aperture of the ion source 100 are extraction optics 110. In certain embodiments, the extraction optics 110 comprise one or more electrodes. In certain embodiments, the extraction optics 110 comprises a suppression electrode 111, which is negatively biased relative to the plasma so as to attract ions through the extraction aperture. The suppression electrode 111 may be electrically biased using a suppression power supply (not shown). The suppression electrode 111 may be biased so as to be more negative than the extraction plate of the ion source 100. In certain embodiments, the suppression electrode 111 is negatively biased by the suppression power supply, such as at a voltage of between −3 kV and −15 kV.

In some embodiments, the extraction optics 110 includes a ground electrode 112. The ground electrode 112 may be disposed proximate the suppression electrode 111. The ground electrode 112 may be electrically connected to ground. Of course, in other embodiments, the ground electrode 112 may be biased using a separate power supply.

In other embodiments, the extraction optics 110 may comprise in excess of two electrodes, such as three electrodes or four electrodes. In these embodiments, the electrodes may be functionally and structurally similar to those described above, but may be biased at different voltages.

Each electrode in the extraction optics 110 may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the apertures in the extraction optics 110 are aligned such that the ions 1 pass through apertures.

The electrodes in the extraction optics 110 may be separated, both physically and electrically, through the use of one or more insulators 115. Further, in some embodiments, insulators 115 are also used to separate the ion source 100 from the suppression electrode 111.

Located downstream from the extraction optics 110 is a mass analyzer 120. The mass analyzer 120 uses magnetic fields to guide the path of the extracted ions 1. The magnetic fields affect the flight path of ions according to their mass and charge. A mass resolving device 130 that has a resolving aperture 131 is disposed at the output, or distal end, of the mass analyzer 120. By proper selection of the magnetic fields, only those ions 1 that have a selected mass and charge will be directed through the resolving aperture 131. Other ions will strike the mass resolving device 130 or a wall of the mass analyzer 120 and will not travel any further in the system.

A collimator 140 may be disposed downstream from the mass resolving device 130. The collimator 140 accepts the extracted ions 1 that pass through the resolving aperture 131 and creates a ribbon ion beam formed of a plurality of parallel or nearly parallel beamlets. In other embodiments, the ion beam may be a spot beam. In this embodiment, an electrostatic scanner is used to move the spot beam in the first direction, as defined below.

Located downstream from the collimator 140 may be an acceleration/deceleration stage 150. The acceleration/deceleration stage 150 may be referred to as an energy purity module (EPM). The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 150 is the movable workpiece holder 160.

In some embodiments, one or more lenses may be disposed along the beam line. A lens may be disposed before the mass analyzer 120, after the mass analyzer 120, before the collimator 140 or another suitable location.

The workpiece 10 is disposed on a movable workpiece holder 160.

In certain embodiments, the forward direction of the ion beam is referred to as the Z-direction, the direction perpendicular to this direction and horizontal may be referred to as the first direction or the X-direction, while the direction perpendicular to the Z-direction and vertical may be referred to as the second direction or Y-direction.

Thus, in operation, the movable workpiece holder 160 moves in the second direction from a first position, which may be above the ion beam 2 to a second position, which may be below the ion beam 2. The movable workpiece holder 160 then moves from the second position back to the first position. The ion beam 2 is wider than the workpiece 10 in the first direction, ensuring that the entirety of the workpiece 10 is exposed to the ion beam 2.

In certain embodiments, sensors are used to monitor the ion beam. For example, Faraday cups may be used to measure the beam current at or near the workpiece. Other beam monitoring devices may also be employed. These other beam monitoring devices may include multipixel profilers, dose cups, and set up cups.

In addition to the use of insulators between the electrodes in the extraction optics, insulators 115 may also be used in conjunction with electrical feedthroughs, Faraday sensors, electrostatic cups, lenses and high voltage stacks. For example, insulators may be disposed in the acceleration/deceleration stage 150 to provide electrical feedthroughs for the rods in the EPM.

In other embodiments, the insulators may be used as electrical feedthroughs to supply voltage through the chamber walls of the ion source 100.

In some embodiments, an insulator is used to isolate the one or more lenses from ground. In other embodiments, an insulator may be used to isolate the Faraday cups or beam monitoring devices from ground.

Of course, any component that is maintained at a voltage that is different from the voltage of surrounding components (or from ground) may be isolated using the insulator described herein.

In some embodiments, some of the ions or other material that are extracted from the ion source 100 may be deposited on the insulators 115. This material may be electrically conductive, such that over time, a conductive path may form on the exterior surface of the insulator, causing the suppression electrode 111 to electrically short to the ion source 100 or the ground electrode 112.

Figure 2A:
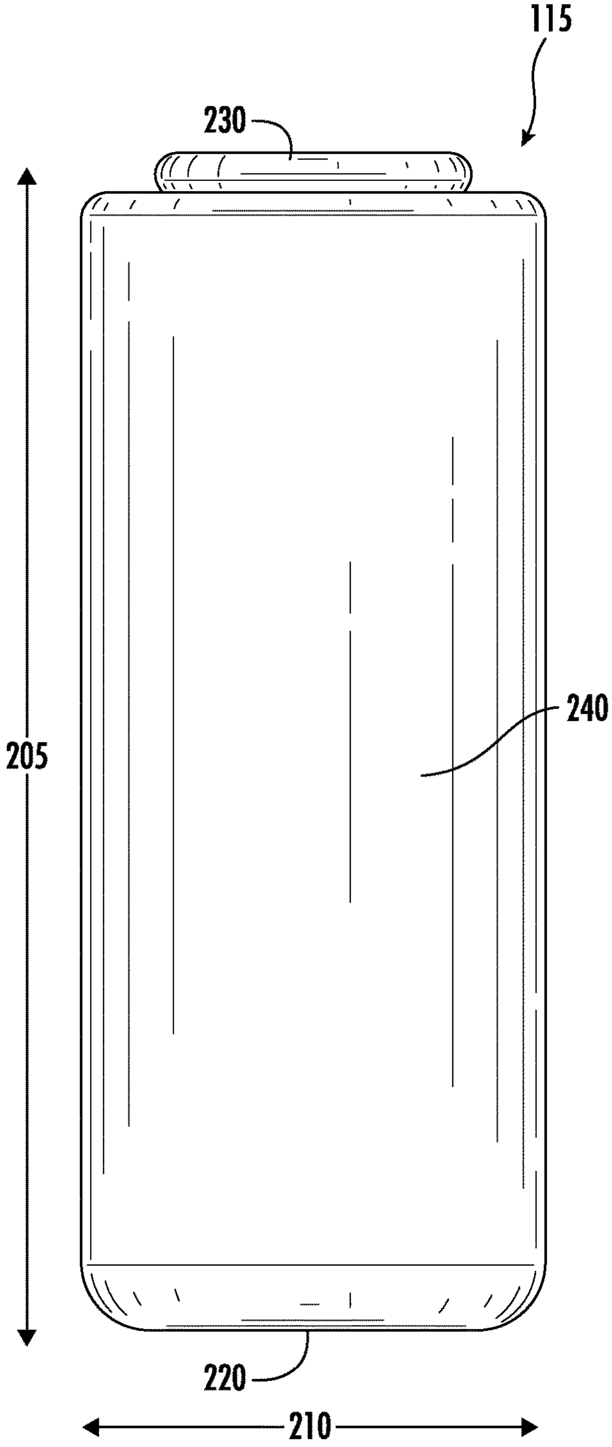
FIGS. 2A-2B show an insulator according to one embodiment.
Figure 2B:
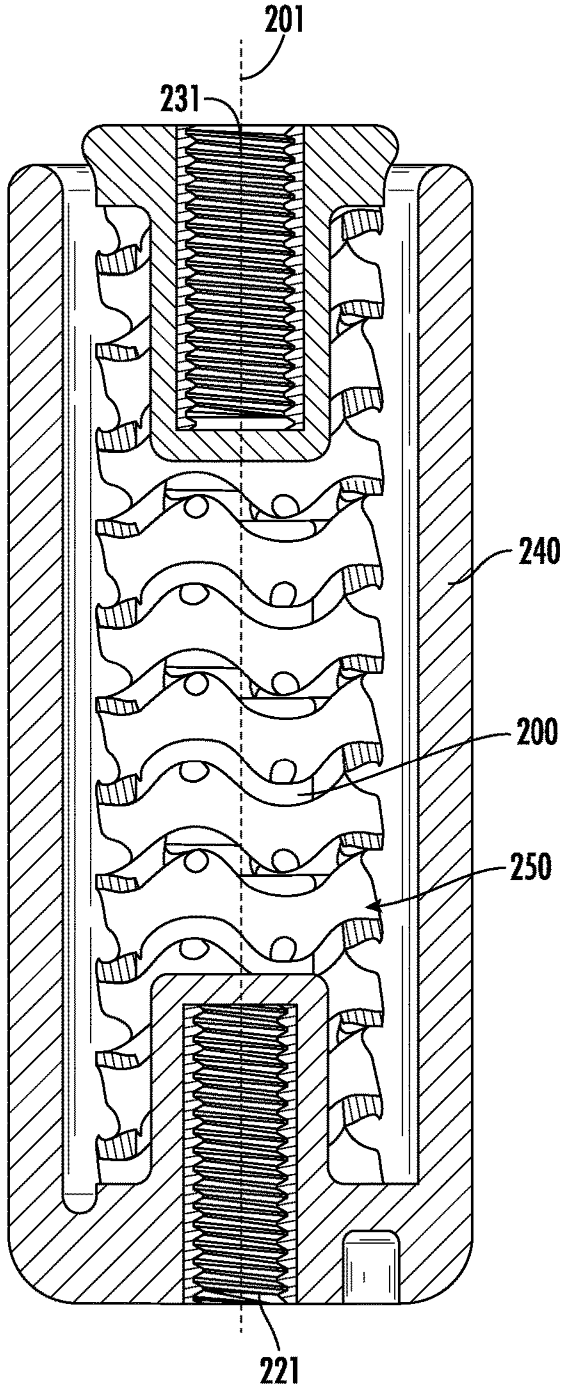

FIGS. 2A-2B show a first embodiment of an insulator 115 that is resistant to the formation of this conductive path. FIG. 2B shows a cross-sectional view of the insulator 115 of FIG. 2A. The insulator 115 has a height 205, which may be determined by the configuration of the ion implantation system. For example, insulators that are used for the extraction optics 110 may have a height 205 of between 0.25 and 3 inches and a width 210 of between 0.25 and 2 inches. Other insulators, such as those used to isolate other components, may have a height 205 of, for example, between 1 and 12 inches and a width 210, which may be, for example, between 1 and 24 inches, although other dimensions are also possible. In certain embodiments, the shaft 200 of the insulator may be cylindrical. However, in other embodiments, the shaft 200 of the insulator may be an oval cylinder, an elliptical cylinder, a cuboid or any other suitable shape. The shaft 200 of the insulator 115 has a first end 220 and a second end 230. In some embodiments, the first end 220 has an interior threaded channel 221, which may be disposed along the central axis 201 of the shaft 200. Likewise, an interior threaded channel 231 may be disposed on the second end 230. These interior threaded channels allow screws to be inserted so as to secure the insulator 115 in position. For example, screws may be used to secure the insulator 115 between the suppression electrode 111 and the ground electrode 112. In other embodiments, the ends of the insulator are affixed to the electrodes using a different mechanism. For example, the insulator may include external threaded posts protruding from each end.

In this embodiment, a sheath 240 is attached at the first end 220 of the shaft 200 and extends toward the second end 230, but does not contact the second end 230. Thus, the sheath 240 extends outward from the shaft 200 and surrounds a portion of the shaft 200. In embodiments where the shaft is cylindrical, the sheath 240 may be cup-shaped. In some embodiments, the distance between the second end 230 and the end of the sheath 240 may be 0.04 to 0.5 inches. In this embodiment, the sheath 240 is made from the same material as the shaft 200. The sheath 240 may have a thickness of 0.02 to 1.5 inches or more, although other dimensions are also possible. Although the figures show the sheath 240 as being straight walled, other embodiments are also possible. The sheath 240 may have slanted walls or may be pear shaped, or bulbous. Thus, the shape of the sheath 240 is not limited as long as it does not contact the shaft 200 and covers at least a portion of the shaft 200.

The shaft 200 of the insulator 115 comprises a shaft lattice 250 disposed on its outer surface. Thus, in this embodiment, the shaft lattice 250 is disposed in the gap between the shaft 200 and the interior surface of the sheath 240, and is disposed on the shaft 200. In some embodiments, the gap between the shaft 200 and the interior surface of the sheath 240 is between 0.05 and 0.125 inches, although other dimensions are possible. The thickness of the shaft lattice 250 is such that it is smaller than the gap.

While FIG. 2A-2B shows the sheath 240 as being made of the same material as the shaft 200, other embodiments are also possible.

Figure 3:
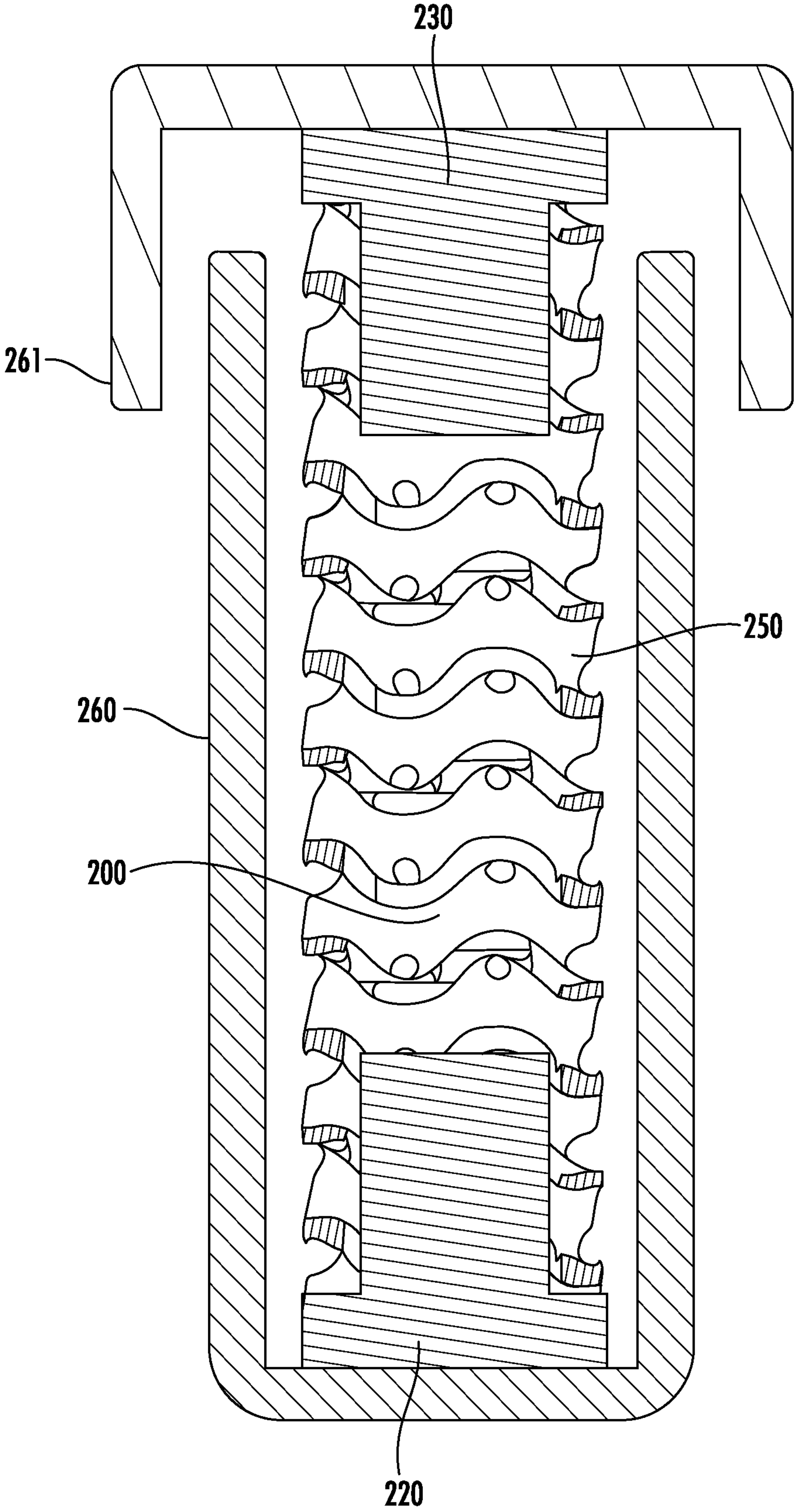
FIG. 3 shows an insulator with an external sheath.

FIG. 3 shows another embodiment, where the external sheath 260 is separate from the shaft 200. In this embodiment, the external sheath 260 may be attached to one of the ends, such as the first end 220 of the shaft 200. The external sheath 260 may be made of a conductive material, such as stainless steel, in some embodiments. In other embodiments, the external sheath 260 may be made from an insulating material, but may not be integral with the shaft 200. As shown in FIG. 2B, the shaft lattice 250 is disposed on the shaft 200 and disposed between the shaft 200 and the external sheath 260. FIG. 3 also shows a second external sheath 261 which is affixed to the opposite end as the external sheath 260. The second external sheath 261 has a larger width than the external sheath 260 so the two sheaths may be overlapping, as shown in the figure. In some embodiments, the second external sheath 261 may not be present.

Figure 4A:
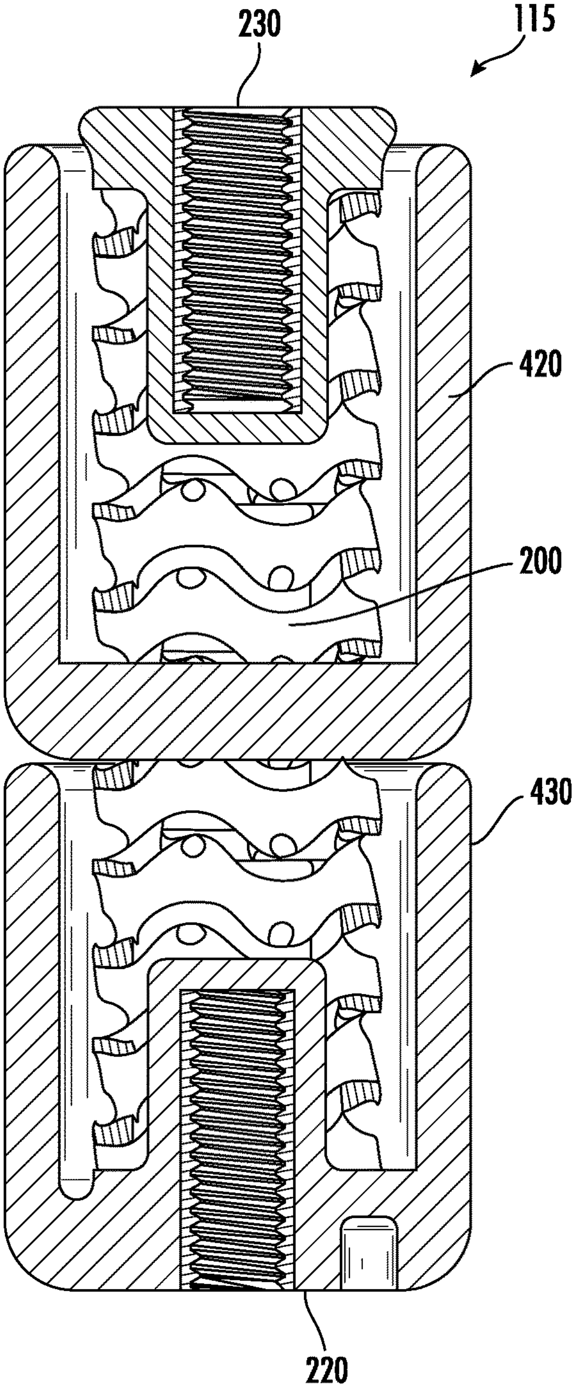
FIGS. 4A-4B show an insulator with multiple sheaths.

FIG. 3 shows multiple external sheaths. However, multiple sheaths may also be constructed when the sheaths are integral with the shaft 200. FIG. 4A shows the insulator with a top sheath 420 and a bottom sheath 430. In this embodiment, the bottom sheath 430 begins at the first end 220 and travels toward the second end to a location near the midpoint of the shaft. The top sheath 420 begins at a location proximate the top of the bottom sheath 430. The top sheath 420 may begin at a location near the midpoint of the shaft 200 and extend toward the second end. In this way, the bottom sheath 430 shields the bottom portion of the shaft 200, while the top sheath 420 only shields a top portion of the shaft 200. In another embodiment, shown in FIG. 4B, the top sheath 420 may extend downward from the second end 230 toward the midpoint of the shaft 200, while the bottom sheath 430 begins at the first end 220 and travels to a location near the midpoint of the shaft 200. In these embodiments, the shaft lattice 250 is disposed on the outer surface of the shaft 200 and is disposed between the shaft and the interior surfaces of the top and bottom sheaths.

Figure 4B:
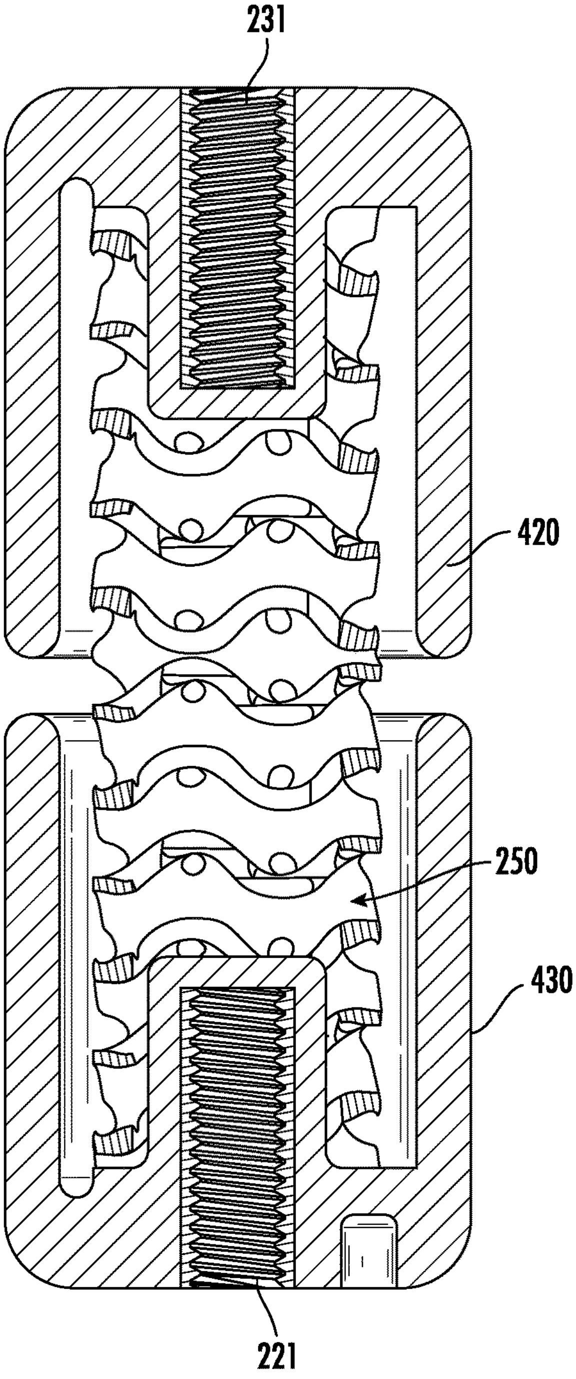

Thus, in each of these embodiments, the insulator comprises a shaft, with a shaft lattice 250 disposed on its outer surface, which is at least partially covered by a sheath. The sheath may be integral with the shaft 200, as shown in FIGS. 2A-2B and 4A-4B, or may be a separate component, as shown in FIG. 3. As noted above, in the case of an external sheath 260, the external sheath 260 may be constructed from a conductive material, or a non-conductive material. There may be one sheath, as shown in FIGS. 2A-2B or multiple sheaths, as shown in FIGS. 4A-4B.

Figure 5A:
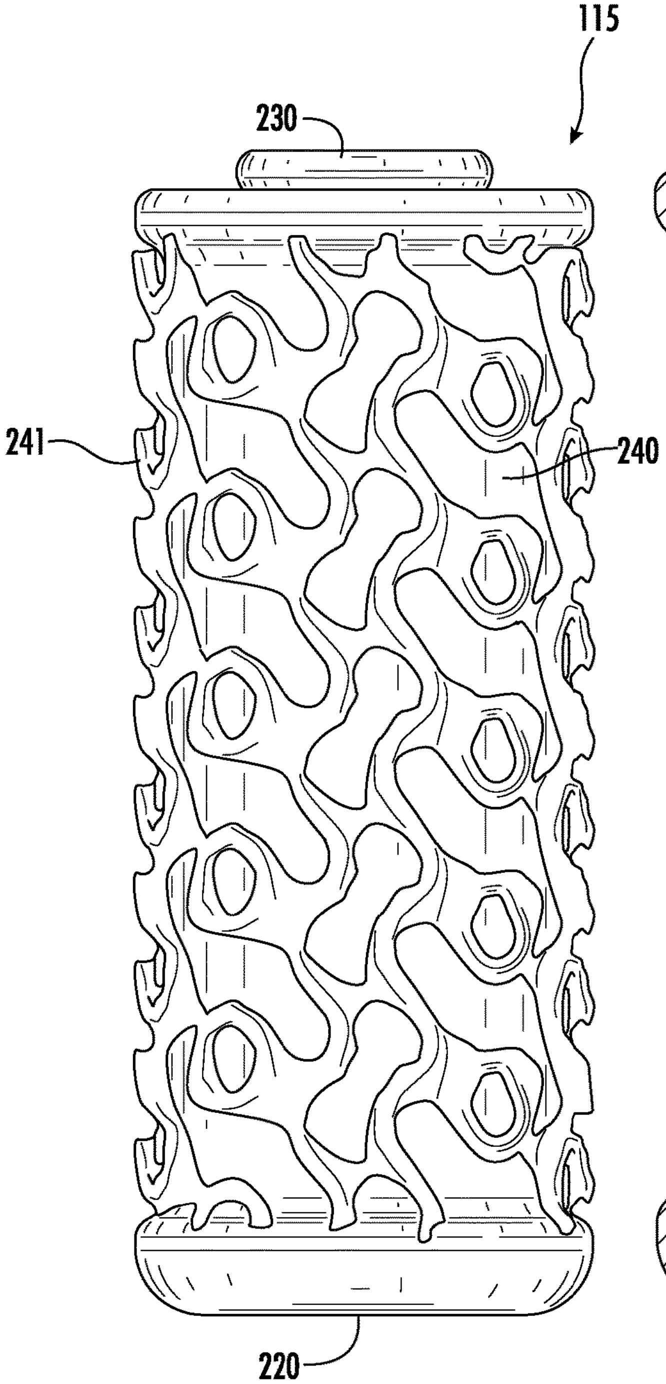
FIGS. 5A-5B show an insulator with lattice disposed on the sheath.
Figure 5B:
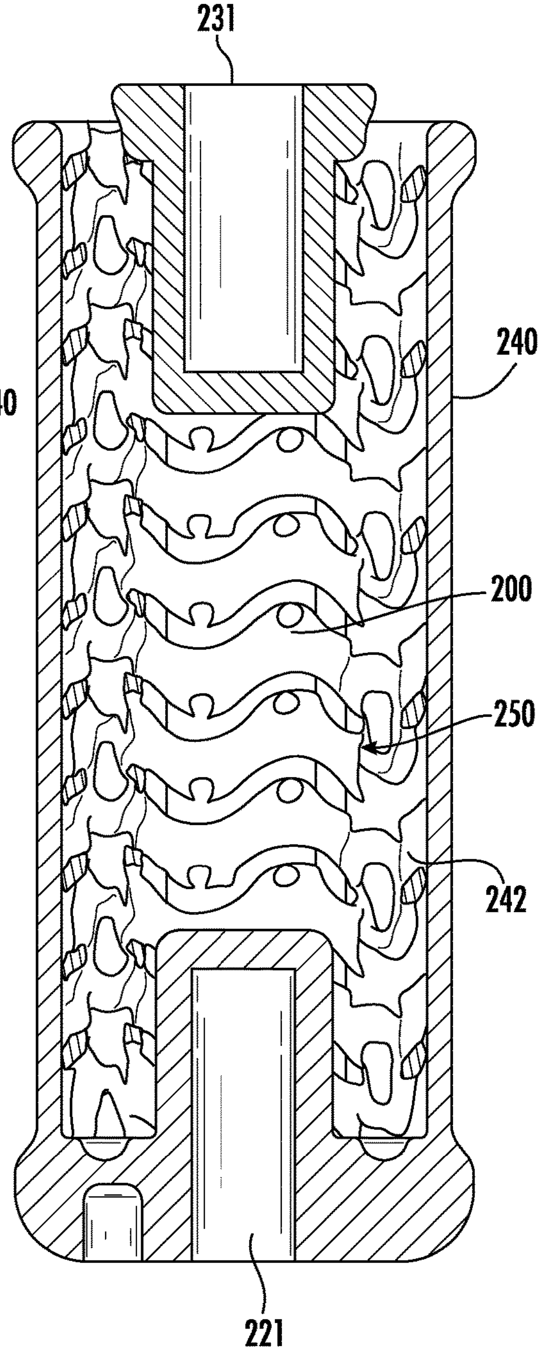

FIG. 5A-5B show a variation of the insulator shown in FIG. 2A-2B. In this embodiment, the sheath 240 is made of the same material as the shaft and has a lattice disposed on at least one of its surfaces. For example, there may be an outer sheath lattice 241, such as is shown in FIG. 5A. In this embodiment, the outer sheath lattice 241 extends outward from the outer surface of the sheath 240. In certain embodiments, there may be an inner sheath lattice 242, as shown in FIG. 5B. In this embodiment, the inner sheath lattice 242 extends inward from the interior surface of the sheath 240 toward the shaft 200. In certain embodiments, the sheath 240 may include both an outer sheath lattice 241 and an inner sheath lattice 242.

Note that the inner and/or outer sheath lattice may also be applied to embodiments having multiple sheaths, such as that shown in FIGS. 4A-4B.

In embodiments where there are both a shaft lattice 250 and an inner sheath lattice 242, the sum of the thickness of these lattices may be less than the size of the gap between the shaft 200 and the sheath 240. For example, in some embodiments, the thickness of each lattice may be between 0.02 and 0.075 inches. Of course, if the gap is larger, then thickness of the lattices may also grow.

The lattices described herein may be any patterned three-dimensional structure, typically defined by a unit cell. The unit cell is then replicated a plurality of times in several directions to form the lattice. FIGS. 6A-6L shows various types of unit cells that may be used. Note that these unit cell do not represent all of the unit cells that may be used to define the lattice.

Figure 6A:
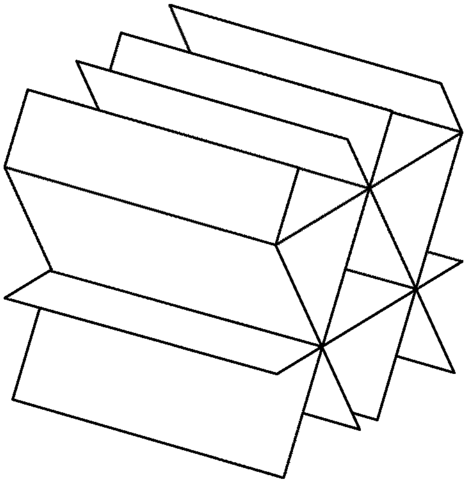
FIGS. 6A-6L show different unit cells that may be used to form a lattice.
Figure 6B:
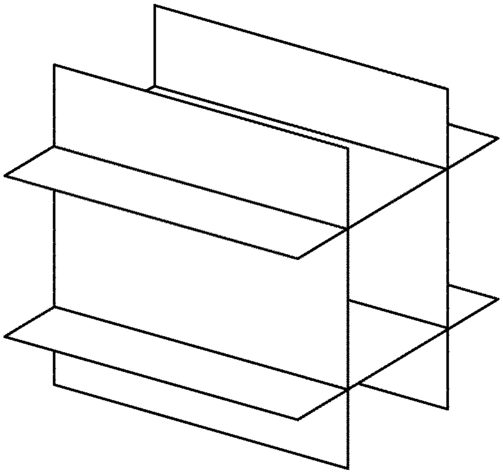
Figure 6C:
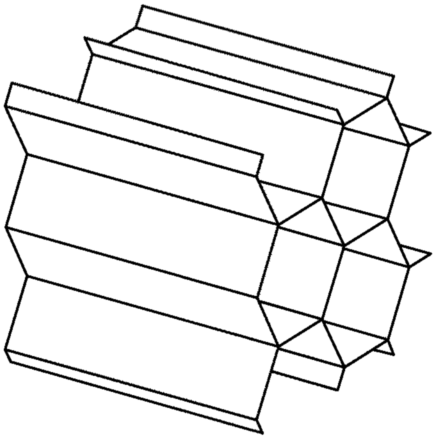
Figure 6D:
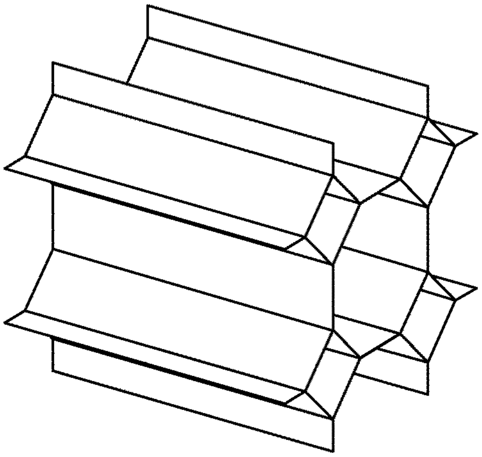

FIGS. 6A-6D show extruded two-dimensional shapes that may be used as the unit cell. FIG. 6A shows a plurality of triangles. FIG. 6B shows a rectangular unit cell. FIG. 6C shows a plurality of hexagons. FIG. 6D shows a plurality of octagons. Of course, other two-dimensional shapes may also be used, such as diamonds and pentagons. Therefore, the disclosure is not limited to these extruded shapes. Each of these extruded two-dimensional shapes are arranged adjacent to one another, such that multiple unit cells share at least one common wall. In some embodiments, these extruded two-dimensional shapes extend radially outward from the shaft 200 to define the lattice.

Figure 6E:
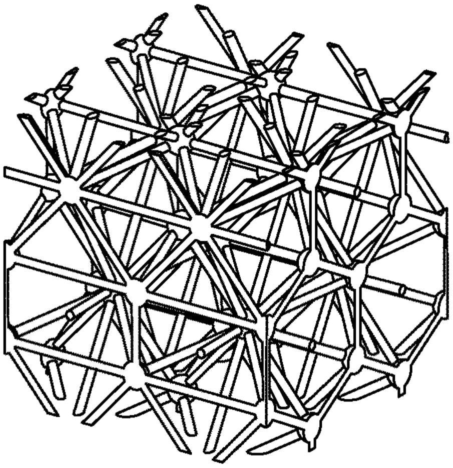
Figure 6F:
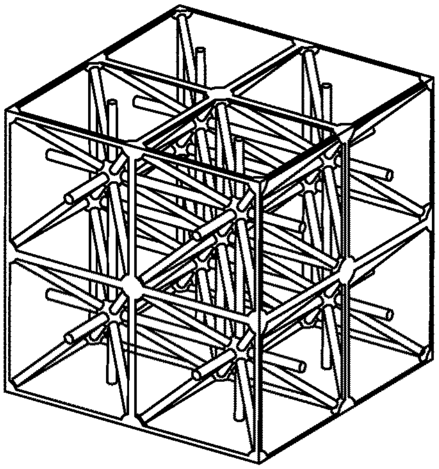
Figure 6G:
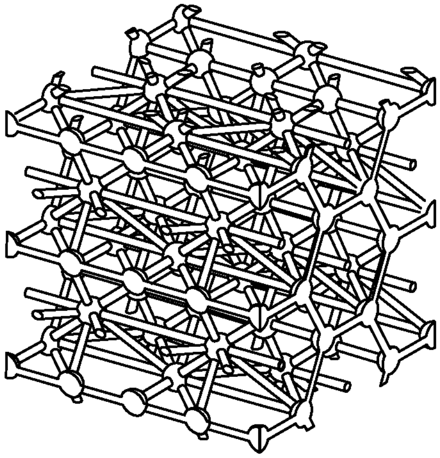
Figure 6H:
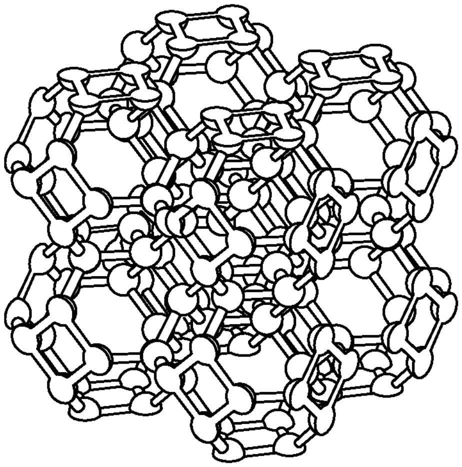
Figure 6I:
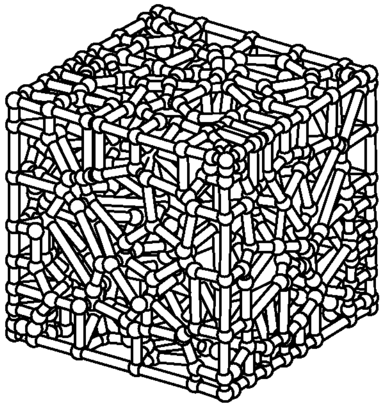

FIGS. 6E-6I show other lattice units that are defined using various geometries that utilize ball and beam elements. In this configuration, a ball defines a vertex, from which two or more beams are attached. The ball and beam configuration may be used to define a plurality of different geometries. FIG. 6E shows the ball and beam elements forming a plurality of triangles. FIG. 6F shows the ball and beam elements forming a plurality of rectangles. FIG. 6G shows the ball and beam elements forming a plurality of hexagons. FIG. 6H shows the ball and beam elements forming a plurality of octagons. FIG. 6I shows the ball and beam elements connected in a random way, also referred to as stochastic. Of course, the ball and beam element may be used to create other shapes, which can also be used to form the lattice.

Figure 6J:
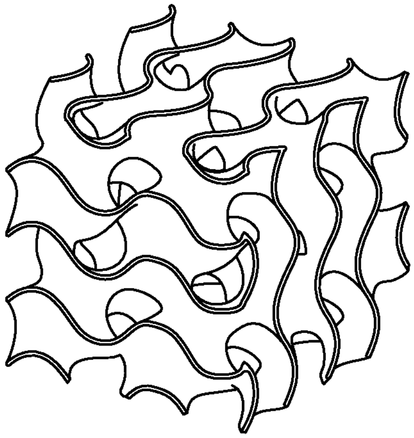
Figure 6K:
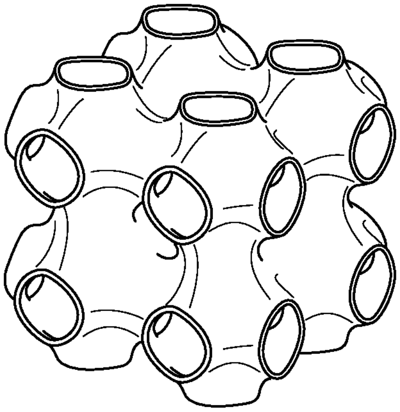
Figure 6L:
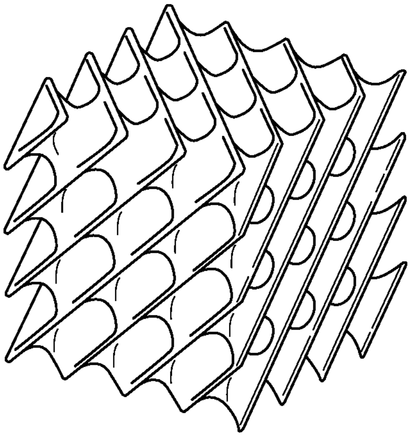

FIG. 6J-6L shows function generated lattice. FIG. 6J shows a gyroid lattice. A gyroid is triply periodic and comprises minimal iso-surfaces and has no straight lines. In other words, a gyroid unit cell may be attached to other like unit cells to form a larger lattice. FIG. 6K shows another function generated unit cell, referred to as primitive. FIG. 6L shows a diamond shaped function generated unit cell. Of course, other functions may be used to generate these unit cells, which in turn are used to create the lattice.

Figure 7:
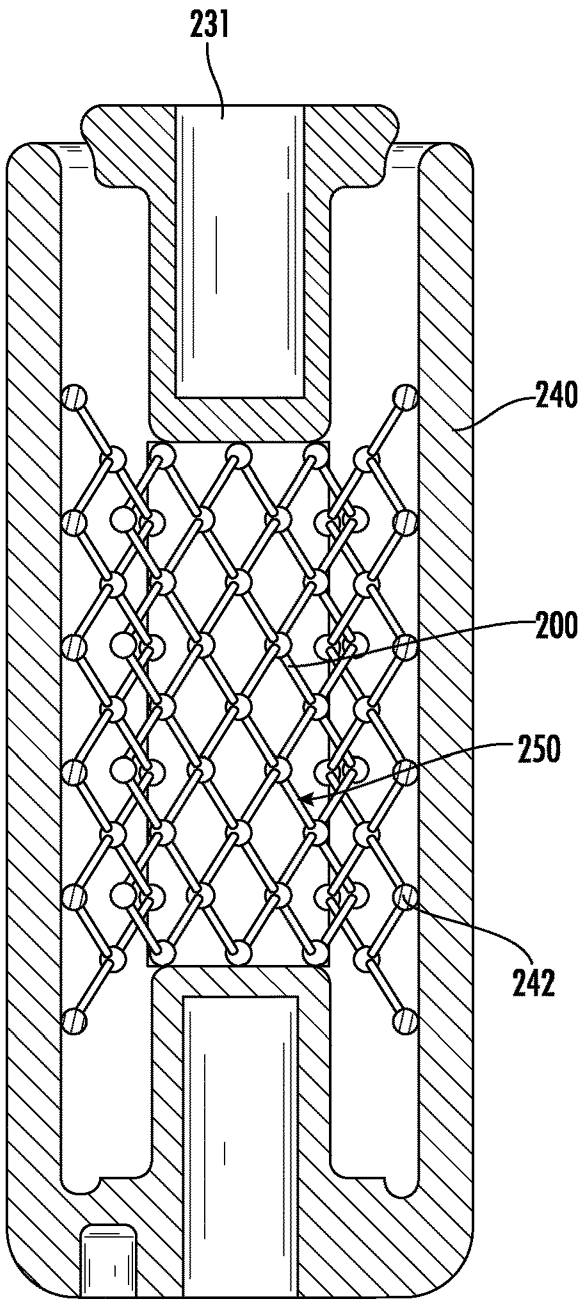
FIG. 7 shows an insulator with interwoven lattices.

FIG. 7 shows another embodiment of an insulator, wherein there is a shaft lattice 250 and an inner sheath lattice 242. However, in this embodiment, the ball and beam elements (see FIGS. 6E-6I) are fabricated such that the two lattices are interwoven with one another, but do not touch each.

Note that the various lattices described in these embodiments may have a constant density, where density is defined as the amount of solid material per cubic volume. However, in other embodiments, the density may vary. The density of the lattice may be changed in different ways. For the unit cells shown in FIGS. 6A-6D, a change in density may be achieved by changing the size of the geometric shapes, or by increasing the wall thicknesses. For the ball and beam lattice shown in FIGS. 6E-6I, the density can be changed by varying the length or diameters of the beams, or by varying the volume of the balls. For the function generated lattices, shown in FIGS. 6J-6L, the coefficients of the functions may be modified to change the density.

Figure 8:
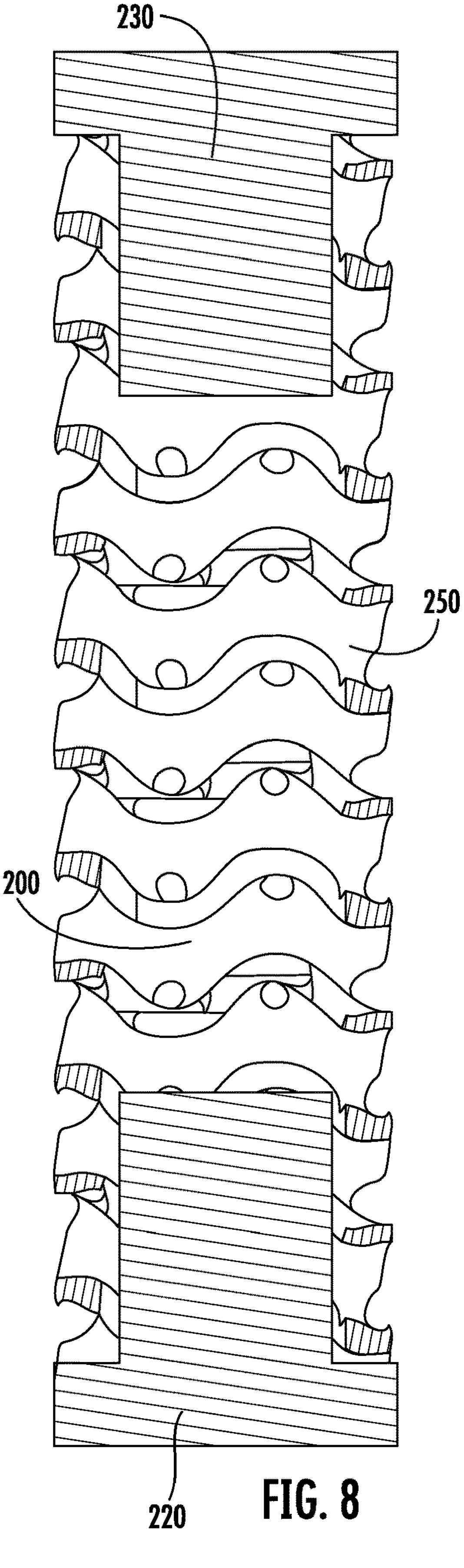
FIG. 8 shows an insulator without a sheath according to one embodiment.

In the previous embodiments, the shaft 200 may be at least partly covered by a sheath. However, other embodiments are possible. FIG. 8 shows an insulator having a shaft 200 with a first end 220 and a second end 230, wherein a shaft lattice 250 is disposed on the outer surface of the shaft 200.

Returning to FIGS. 2A-2B, 3, 4A-4B, 5A-5B, 7 and 8, the density of the shaft lattice 250 may be varied so that it is highest near the first end, and less at the second end. Conversely, the density may be such that it is highest at the second end and less at the first end. In another embodiment, the density may be highest at the midpoint of the shaft.

In one particular embodiment, the density may be the lowest at the midpoint of the shaft. High density at the ends may be beneficial as it adds structure near the threaded areas. In addition, the reduced density near the center may help limit condensation and increase the heat in this area. This may also help to thermally isolate the two ends from one another.

Similarly, the density of the inner sheath lattice 242 may be varied in any of these ways as well.

In all embodiments, the insulator 115 may be constructed from an insulating material. Suitable materials for use include aluminum oxide ($Al_2O_3$), zirconium oxide ($ZrO_3$), yttrium oxide ($YO_3$) or a combination of these. In some embodiments, resin bushings may be used. Due to the shape of the insulator, it may be preferable to construct the insulator using an additive manufacturing process, such as stereolithography. In addition to the ability to create the desired shapes, additive manufacturing also allows the insulator 115 to be constructed as one unitary component. Further, when using an additive manufacturing process, the lattice may be created with the insulator. Further, in all embodiments, except FIG. 3, the sheath or sheaths may also be made from the same material as the shaft 200. Thus, when using an additive manufacturing process, the sheath may be created with the shaft.

Figure 9A:
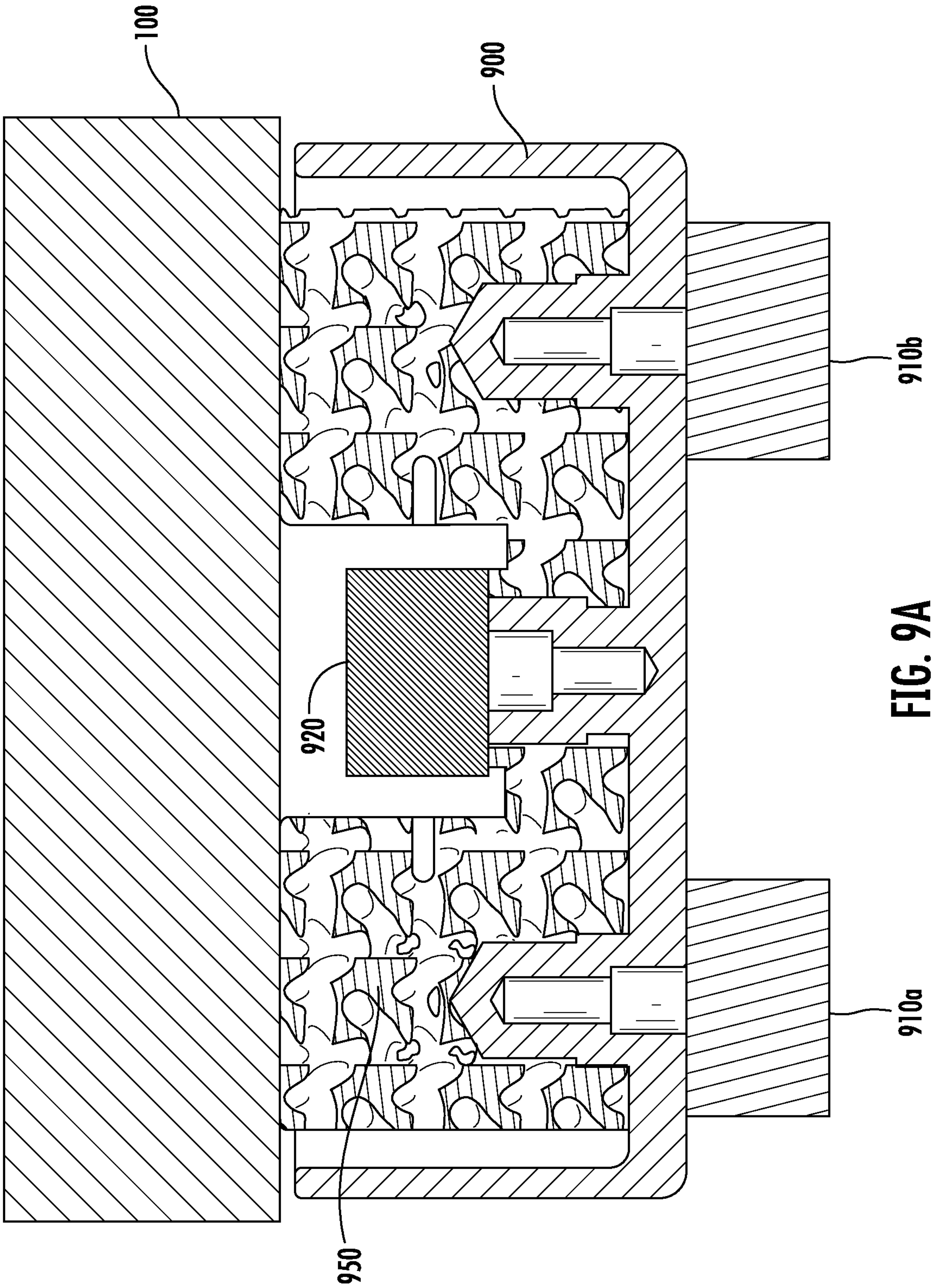
FIGS. 9A-9B show an insulator according to another embodiment for use with the IHC ion source.
Figure 9B:
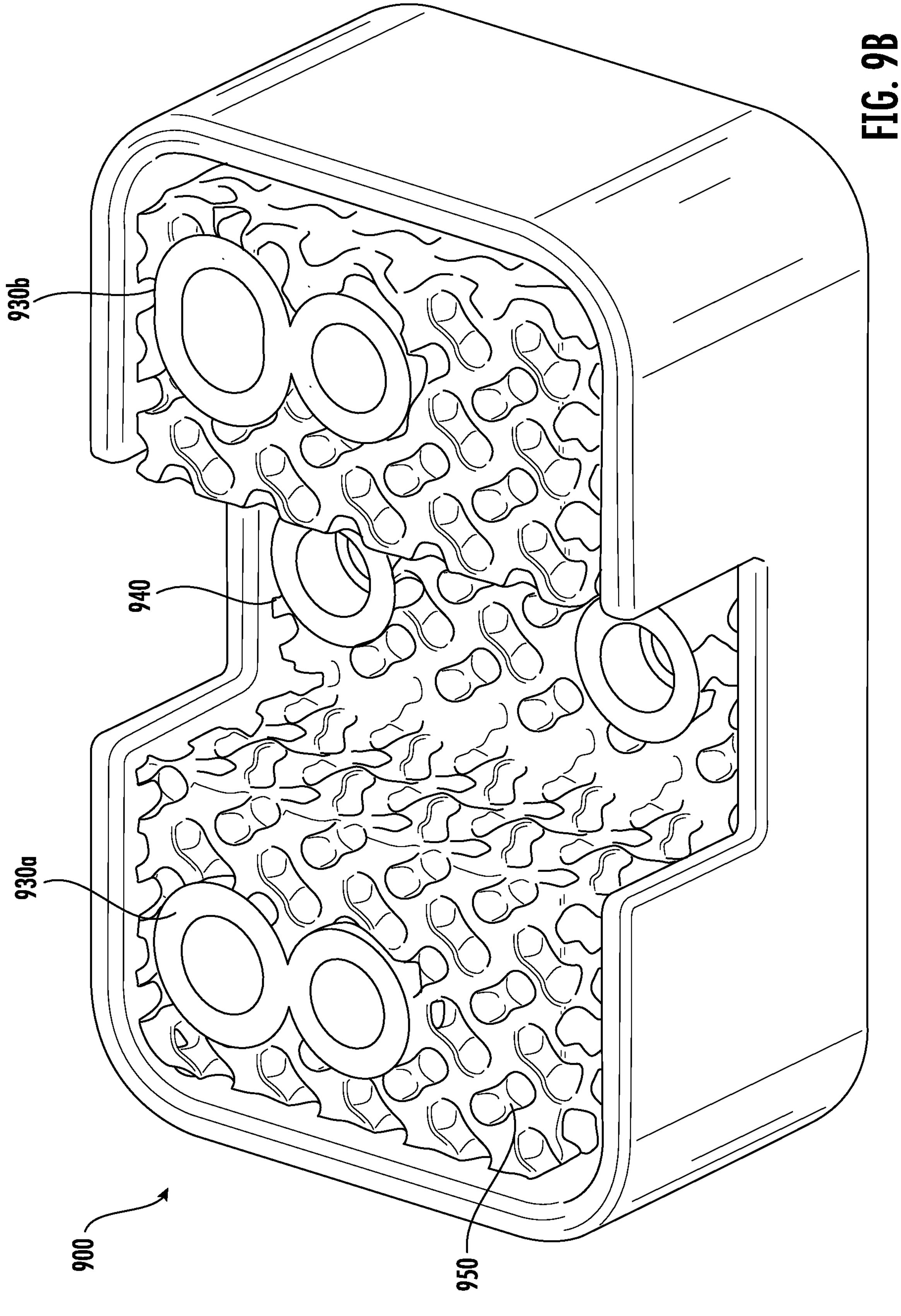

FIGS. 9A-9B show another embodiment of an insulator 900 made with a lattice. In this embodiment, the insulator 900 may be made from any of the materials described above. Additionally, the insulator 900 is intended to electrically and physically isolate the various voltages and components used by the ion source 100. The ion source 100 may be an indirectly heated cathode ion source. As best seen in FIG. 9A, the insulator 900 is mounted to the ion source 100, which is maintained at a first voltage, which may be ground. Additionally, the insulator 900 is also used to secure the cathode support member 920 that provides the bias voltage to the cathode, which is different from the first voltage. Finally, the insulator 900 is used to secure the clamps 910*a*, 910*b* that supply the current to the filament, which is also separate from the first voltage and the bias voltage. The insulator 900 may be formed as an open box, which may be oval, rectangular, hexagonal or another shape. Mounting holes are provided in the insulator 900 to affix these various components to the insulator 900. Specifically, through holes are used to secure the insulator 900 to the ion source 100. Threaded mounting holes are used to secure the clamps 910*a*, 910*b* to the insulator 900 and to secure the cathode support member 920 to the insulator 900.

Different voltages contact the insulator 900; the first voltage applied to the ion source 100, the bias voltage supplied to the cathode support member 920 and the voltage applied to the clamps 910*a*, 910*b*. Conductive paths may form due to deposition to materials from the ion source. For example, a conductive path may form from the clamps 910*a*, 910*b* to the cathode support member 920 or to the ion source 100. In these cases, the conductive path forms along the outside surface of the insulator 900, and then travels to one or more of the mounting holes. As best seen in FIG. 9B, to increase the tracking distance between these various components, a lattice 950 may be disposed in the inside of the open box and between mounting holes 930*a*, 930*b* and 940.

As described above, this insulator 900 may also be made using an additive manufacturing process, such as stereolithography. In this way, the lattice 950 is integral with the open box of the insulator 900.

The embodiments described above in the present application may have many advantages. As can be seen in each of these figures, the lattice includes open spaces interspersed with the structural components. By applying a lattice to the outer surface of the shaft 200 and optionally the sheath, the length of the outer surface is increased. Further, the pattern of open spaces and structure also decreases the line-of-sight in the lattice. This increase in length, and reduction of surfaces that are visible via line-of-sight combine to make it more difficult to coat the lattice, which creates an electrically conductive path.

Additionally, the lattice may be used adjust the thermal profile of the insulator. This may prevent condensation from forming on the interior of the insulator, between the shaft and the sheath. Depending on the types of gases in the area, condensation may form on hotter or cooler areas within the insulator. Based on the density of the lattice, the heat within the insulator can be managed to heat or cool areas where deposition is likely to occur.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An insulator, comprising:
a shaft having a first end and a second end; and
a shaft lattice disposed on an outer surface of the shaft.

2. The insulator of claim 1, wherein a density of the shaft lattice is not constant along a length of the shaft.

3. The insulator of claim 2, wherein the density of the shaft lattice is greater at the first end and at the second end than at a location between the first end and the second end.

4. The insulator of claim 1, further comprising a sheath surrounding a portion of the shaft, where the shaft lattice is disposed in a space between the shaft and an inner wall of the sheath.

5. The insulator of claim 4, wherein the sheath is made from a conductive material, is attached to the first end of the shaft and extends toward the second end.

6. The insulator of claim 4, wherein the sheath is made from an insulating material and extends from the first end of the shaft toward the second end.

7. The insulator of claim 6, wherein an inner sheath lattice is disposed on the inner wall of the sheath in the space between the shaft and the inner wall of the sheath.

8. The insulator of claim 7, wherein the inner sheath lattice is interwoven with the shaft lattice.

9. The insulator of claim 6, wherein an outer sheath lattice is disposed on an outer wall of the sheath.

10. The insulator of claim 4, further comprising a second sheath covering a second portion of the shaft.

11. The insulator of claim 10, wherein the sheath and the second sheath are made from an insulating material and wherein an inner sheath lattice is disposed on the inner wall of the sheath and an inner wall of the second sheath.

12. The insulator of claim 11, wherein the second sheath extends from the second end of the shaft toward the first end.

13. The insulator of claim 11, wherein the second sheath extends from the shaft at a position between the first end and the second end and extends toward the second end.

14. An ion implantation system comprising:
an ion source;
at least two electrodes disposed outside the ion source; and
the insulator of claim 1, disposed between the at least two electrodes to physically and electrically separate the at least two electrodes from each other.

15. An ion implantation system comprising:
an ion source;
at least two electrodes disposed outside the ion source; and
the insulator of claim 4, disposed between the at least two electrodes to physically and electrically separate the at least two electrodes from each other.

16. An insulator, comprising:
an open box having a plurality of mounting holes for connection to an indirectly heated cathode ion source and other components, where one or more of the plurality of mounting holes are disposed on an inner surface of the open box; and
a lattice disposed in the open box and between the plurality of mounting holes so as to increase a tracking length.

17. An ion implantation system comprising:
an indirectly heated cathode ion source having a cathode and a filament;

a cathode support member to hold the cathode and supply a bias voltage to the cathode;

clamps to supply a current to the filament; and the insulator of claim 16, wherein one or more of the plurality of mounting holes are used to hold the cathode support member and one or more of the plurality of mounting holes are used to secure the clamps.

* * * * *